United States Patent [19]
Ceresa et al.

[11] 3,967,162
[45] June 29, 1976

[54] INTERCONNECTION OF OPPOSITELY DISPOSED CIRCUIT DEVICES

[75] Inventors: Myron Ceresa, Advance, N.C.;
Richard Henry Zimmerman, Palmyra, Pa.

[73] Assignee: AMP Incorporated, Harrisburg, Pa.

[22] Filed: July 23, 1975

[21] Appl. No.: 598,452

Related U.S. Application Data
[63] Continuation of Ser. No. 491,575, July 24, 1974, abandoned.

[52] U.S. Cl.......... 317/101 CM; 174/68.5; 339/61 M
[51] Int. Cl.² .......................................... H05K 1/12
[58] Field of Search ................. 174/68.5; 339/17 R, 339/61 M; 29/626, 628, 625

[56] References Cited
UNITED STATES PATENTS

| | | | |
|---|---|---|---|
| 3,065,383 | 11/1962 | Guillemot | 317/101 CC |
| 3,444,503 | 5/1969 | Mallery | 339/61 M |
| 3,541,222 | 11/1970 | Parks et al. | 317/101 CM X |
| 3,680,037 | 7/1972 | Nellis et al. | 339/61 M |
| 3,718,842 | 2/1973 | Abbott et al. | 317/101 F X |

*Primary Examiner*—Laramie E. Askin
*Attorney, Agent, or Firm*—Russell J. Egan

[57] ABSTRACT

The multiple interconnection module of the present invention is adapted to conductively interconnect the substantially aligned conductive terminals of a pair of circuit devices and consists of a wiring support body formed of a resilient material and a sheet of flexible material secured to the outer surface of the support body. The flexible sheet has a plurality of paired contacts formed thereon in predetermined positions, with wiring strips electrically connecting each pair of contacts. These contacts are exposed on the outer surface of the sheet for engagement with the conductive terminals of the circuit devices and the resilient support body biases the contacts into proper engagement with the conductive terminals.

9 Claims, 6 Drawing Figures

U.S. Patent June 29, 1976 3,967,162
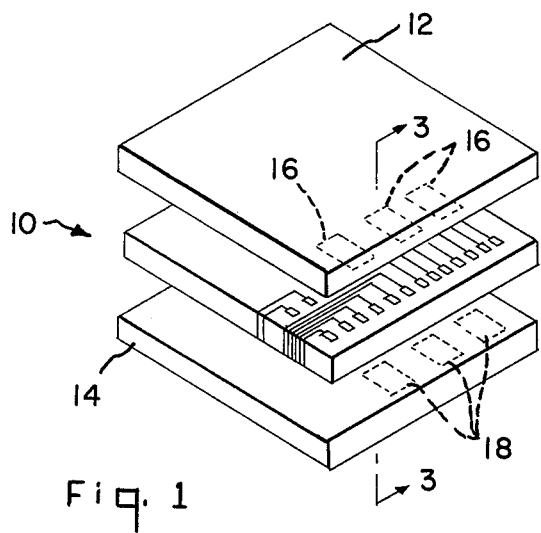
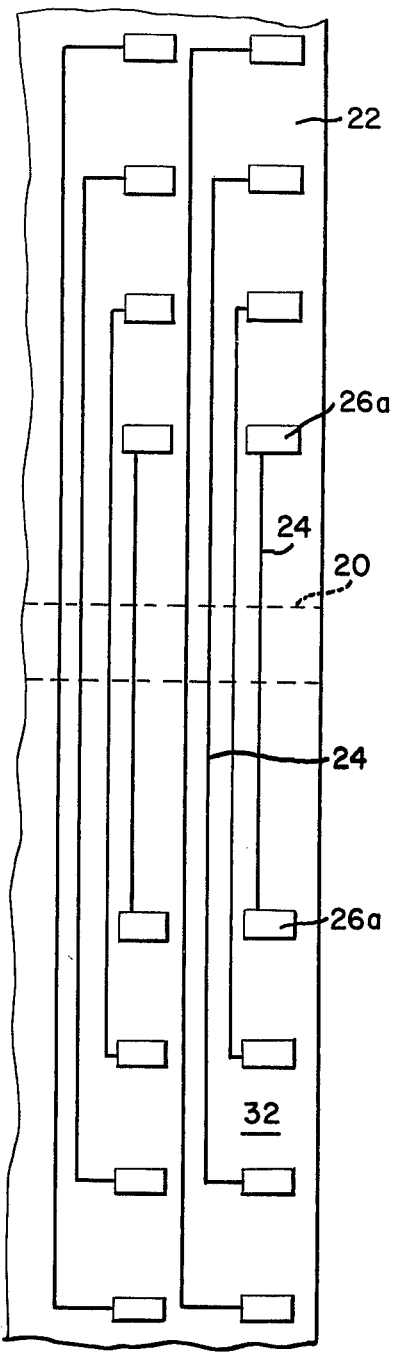
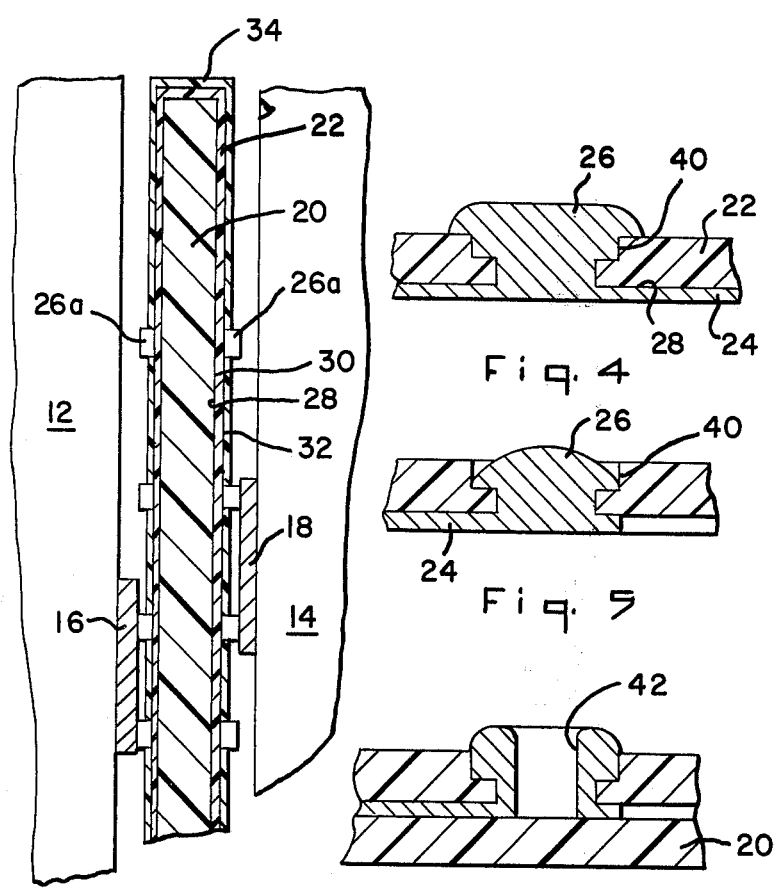
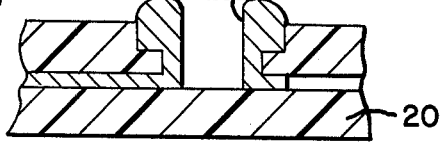
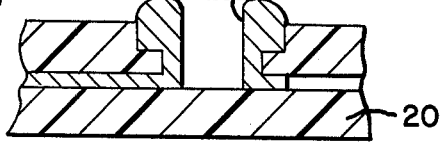

INTERCONNECTION OF OPPOSITELY DISPOSED CIRCUIT DEVICES

This is a continuation of application Ser. No. 491,575, filed July 24, 1974, now abandoned.

The present invention relates to an electrical connection module and, more particularly, to a multiple interconnection module for conductively interconnecting terminals on a pair of spaced circuit devices or the like.

With the advance in development of the miniaturization or micro-electronic circuits on circuit boards or devices, wherein the circuits are frozen in a fixed configuration it has become necessary to develop interconnection techniques for accurately electrically connecting adjacent circuit devices or circuit boards. Since the contacts on such circuit boards or devices are extremely small, the physical interconnection of associated contacts with electrical wiring in a conventional manner is not possible and, as a result, connector boards or screens have been developed for forming these connections.

One technique for forming interconnection boards or screens for electrically connecting adjacent spaced circuit devices requires the molding of a formed spring wiring configuration into a set interconnection pattern held in place by an elastomer. In the molding process for such systems, each spring connection is held within the wiring arrangment by a carrier strip, with the parallel position of each carrier strip determined by the mold design. In such arrangements, a change in the center line position of the contact area requires a change in the die which fabricates the formed spring wiring and also necessitates a new mold for the parallel positioning of the carrier strips.

Another problem with this method of manufacturing an interconnection system is the necessity for removing the carrier strip used for positioning the wiring, after the molding operation is completed. Also, after the elastomer block containing a planar contact running surface within the elastomer is obtained, an additional complicated plating strip is required to elevate the metal contact area above the plane of the elastomer surface. These operations are time consuming and very expensive, and even without them the fabrication of the interconnector system by this process would not readily lend itself to changes in the length of the interconnection system and also would not readily be adapted to semi-automatic or automatic fabrication processes.

Another type of previously proposed interconnector system or module consists of a board or screen formed of a non-conductive pliable material in which a plurality of deformable conductive balls or elements are mounted. Such a system is shown, for example, in U.S. Pat. No. 3,541,222 to Parks et al. Such an arrangment permits electrical connection between superimposed aligned contact elements or terminals in adjacent circuit boards, but relies on the malleability of the deformable elements in order to insure good and reliable electrical contact. However, once the elements are deformed by insertion between one pair of circuit boards, it is possible that the deformation is such as to render them unusable in any other electrical connection for which they may be needed. Accordingly such a device is not entirely satisfactory and is not suitable for repeatitive uses in different circuit board arrangments.

Accordingly, it is an object of the present invention to provide an electrical interconnection module or system for providing conductive connection between the contact terminals of adjacent circuit boards or devices.

Another object of the present invention is to provide an interconnection module or system of the character described which is relatively simple and inexpensive in construction.

Yet another object of the present invention is to provide a modular electrical interconnection system which provides positive contact between contact terminals of adjacent circuit boards and which can accommodate the various spacing between such circuit boards.

A still further object of the present invention is to provide an interconnection system and method of manufacturing such a system which is readily adapted to changes in contact size and location, length and centers, and distances of the contacts, and the spacing between the contacts.

In accordance with one aspect of the present invention, a multiple interconnection module adapted to provide a conductive interconnection between the aligned conductive terminals on a pair of spaced circuit devices or the like, consists of a resilient support body formed of an elastomer material having an outer surface of predetermined configuration selected to fit closely between the circuit devices. A sheet of flexible material having inner and outer surfaces is secured to the resilient support body with its inner surface adjacent the outer surface of that body. The flexible sheet is separately formed from the elastomeric body, and has a plurality of conductive wiring strips formed thereon, with paired contacts formed therein at the respective ends of each of the wiring strips. The contacts in each pair, and their associated wiring strips, are located in a predetermined pattern, with the contacts being in alignment with each other and exposed at the outer surface of the strip for respectively engaging the aligned conductive terminals in the adjacent circuit devices, thereby to form an electrical connection therebetween.

The above, and other objects, features and advantages of the present invention, will be apparent in the following detailed description of illustrative embodiments of the invention, which are to be read in connection with the accompanying drawings, wherein:

FIG. 1 is an exploded perspective view of two superimposed circuit devices having an interconnection module constructed in accordance with the present invention placed between the opposed faces thereof;

FIG. 2 is an enlarged partial plan view of the flexible strip of the interconnector module, showing the contacts and wiring array thereon;

FIG. 3 is a partial sectional view taken along line 3—3 of FIG. 1; and

FIGS. 4–6 are enlarged sectional views of contact elements formed in accordance with other embodiments of the invention.

Referring now to the drawing in detail, and initially to FIG. 1 thereof, a flexible multiple interconnector module or system 10, constructed in accordance with the present invention, is positioned between a pair of spaced circuit boards or devices 12, 14 to provide electrical connection between the conductive terminals 16, 18 of the respective circuit boards. These circuit boards are of known construction, and thus are not illustrated in detail, and their respective conductive terminals are shown schematically in dotted lines, for clarity of illustration.

In the illustrative embodiment of the invention the respective conductive terminals 16, 18 on the circuit boards 12, 14 are located in vertical alignment with each other. However, as will be described hereinafter, the circuit boards and terminals need not be in vertical alignment with each other, but can be in lateral alignment, or in alignment in the same plane, but at angles (e.g. a right angle) to each other.

The interconnection module 10 illustrated in FIGS. 1 and 3, consists of a central elastic support body 20 formed of a resilient material, such as any convenient insulative elastomer. The elastomer support body provides resilient support for a thin sheet of flexible plastic material 22, such as Mylar or Kapton, or other similiar thin flexible insulative plastic strip materials.

Strip 22 is formed initially as an elongated strip and has electrically conductive art work plated thereon in any convenient configuration, such as for example as shown in FIG. 2. As seen therein, this conductive array consists of a plurality of conductive wiring strips 24 having contact pads 26 formed at their opposite ends. Thus each wiring strip 24 provides electrical connection between a pair of contact elements 26. These elements, although illustrated as being rectangular in the drawings, may be formed as circular elements, or in any other desired configuration, depending upon the processing resolution of the photo-resist used in plating the plastic sheet 22.

The plating process to form this conductive array on sheet 22 can take place in any convenient manner, such as for example by conventional additive plating. In such a process, by selective masking of the wiring strips 24 on sheet 22, between the contact areas 26, the actual contact pads can be increased to any desired thickness, with the platable metal, above the surface of the sheet 24 in a convenient operation.

After the sheet 22 is plated with the desired contact array, the sheet is bonded to the elastomer support body 20, in any convenient manner, such as for example, by an adhesive, heat seal, or the like. The sheet 22 is placed over the support body 20 so that the pairs of contact pads 26 are located on opposite sides of the support body 20, in registration with each other. That is, for example, the pads 26a are located, as seen in FIGS. 2 and 3, to be in alignment on opposite sides of the support body 20. To insure proper placement of the pads in this manner, for the reasons described hereinafter, the contact pads are plated on the sheet 22 in a pattern, so that the support body 20 can be placed in the center of the sheet, as illustrated in FIG. 2 by dotted lines, and the sheet is folded along the sides of the body and secured thereto.

It is noted that although the contact pads 26 are symmetrically arrayed so as to be in alignment with each other on opposite sides of the support body, the interconnector wiring strips 24, between the contacts, can be randomly scattered, or patterned, as desired, in order to provide maximum contact areas on the support strip. Of course, it will be appreciated that each wiring strip 24 will provide connection only between its two associated contact pads.

The strip 22, in the embodiment of the invention illustrated in FIG. 3, is secured to support body 20 with its inner surface 28 against the outer surface 30 of the support body. In this embodiment the plated side 32 of the strip 22 faces outwardly from the module. In order to protect the plated wiring strips in the completed module assembly, a thin perforated film 34 is adhered to the sheet 22 over the wiring strips 24 in any convenient manner. The perforations in the overlying film 34 are located to be superimposed over the contact pads 26, so that the pads are exposed at and through the perforations to provide the desired electrical contact. This film provides added insulation to the module assembly, and also acts as a wear protection for the wiring strips during insertion and removal of the module from between the pair of circuit boards.

The size and spacing of the contact pads 26a is selected with respect to the conductive terminals 16, 18 of the circuit boards with which the module is to be used, such that at least two of the contact pads will be engaged with the respective contact terminals when the module is properly positioned. This insures proper connection between the conductive terminals, and eliminates the need to register the interconnection module 10 with respect to the circuit boards. That is, as illustrated in FIGS. 1 and 3, by providing a plurality of interconnector contact pads 26, with the respective pads of each pair located at aligned positions on opposite sides of the support body, when the interconnection module is inserted between a pair of circuit boards a plurality of opposite pairs of contact elements will engage the substantially aligned conductive terminals of the circuit boards, to form an electrical connection therebetween. Thus, each of the conductive terminals 16 of the circuit board 12 will be electrically connected to its respectively associated conductive terminal 18 in circuit board 14.

The resilient support body 20 serves to insure proper connection between the contact pads and their associated conductive terminals by resiliently biasing the pads outwardly against the terminals. Thus, a positive biasing is applied to the contact pads to insure this proper connection. This is distinctive to the construction of the prior art, such as for example, as shown in the Parks et al patent mentioned above, wherein the resilience or malleability or the contact elements themselves is relied on for proper electrical connection.

It is noted that the module 10 may have its entire surface area covered by the contact pads 26, although only a portion of the module in FIG. 1 is shown supplied with these pads, for convenience.

The embodiment of the invention illustrated in FIGS. 1 and 3 is particularly adapted for use with superimposed, parallely extending circuit boards. However, the invention is also adapted to be used with circuit boards or devices which extend at angles to each other. For example, with the circuit boards 12 and 14 extending at right angles to each other, the interconnection module 10 can be formed as an enlarged rectangular block, with the contact pads 26 located on two adjacent sides of the support body so that the contact pads of each pair lie in perpendicularly extending planes. By arraying the contact pads on the carrier strip 22 in this manner, the desired electrical connection between aligned conductive terminals in the angularly extending circuit boards will also be made.

In addition, it is noted that although the support body 20 of the illustrated embodiment is shown as being a rectangular member, the support body can also be formed as a circular rod of elastomer material, with the sheet 22 secured thereto. In this embodiment of the invention the pairs of contacts 26 would be located at diametrically opposed positions on the circular rod, so as to form the desired connections between the conductive terminals 16, 18. Such a circular body can also be used to form a connection between angularly related circuit boards, by locating the contact pads 26 at angularly spaced but peripherally aligned positions on the surface of the support body.

Another form of making the interconnection module of the present invention is illustrated in FIGS. 4–5. In these embodiments of the invention, the flexible strip 22 has the wiring strips 24 formed on its inner surface 28, i.e. the surface which is to be positioned adjacent the resilient support body 20. The sheet 22 is plated with the wiring strips 24 in the desired array, and secured to the support body 20 in any convenient manner as is heretofore described. Thereafter, the flexible strip 22 is chemically milled or etched in any convenient manner so as to form holes therein at each location where it is desired to have a contact, typically at each end of the wiring strips 24. The contacts can then be electroformed directly on the previously plated wire strips, through the aperture 40. This procedure eliminates the need for the protective film 34 of the previously described embodiment.

By the conventional "plate-through-hole" technique, the wiring strips 24 and contact pads 26 can be electroformed on the flexible strip 22 simultaneously. The contacts, depending upon the size of the hole 40 in the sheet 22, can be solid, as illustrated in FIG. 5, or each can have a hole 42 in its center as shown in FIG. 6.

After the completion of the plate through hole process, the sheet 22 is bonded to the elastomer body 20, with the wiring strips against the surface 30 of the support body and the contact pads 26 exposed through the holes in the sheet 22. Since all the wiring strips are on the side of the sheet 22 which is opposite to the contact area, there is no need for an overlay of protective insulated coating such as previously described.

Accordingly, it will be appreciated that a relatively simple and inexpensive connecting block and method for manufacturing the same has been described which will effect accurate and positive contacts between the aligned conductive terminals of circuit boards or devices. The interconnection module is not subject to the wear or damage of previously proposed constructions and is not subject to the disadvantages of high fabrication costs or the need for special fabrication equipment. Moreover, the arrangement of the present invention permits design flexibility in the array of the contact pads and the wiring strips and allows the entire surface of the support block to be covered by contact pads. Moreover, because the pads are arrayed in a regular pattern by a plating process, the strips can be conveniently manufactured in any desired lengths or thicknesses, thereby to enable the interconnection module to be readily replaced in the event of changes in the circuit boards which it is to interconnect.

Although illustrative embodiments of the present invention have been described herein with reference to the accompanying drawings, it is to be understood that the invention is not limited to those precise embodiments, but that various changes and modifications therein may be effected by one skilled in the art without departing from the scope or spirit of this invention.

What is claimed is:

1. A non-registered interconnection module conductively interconnecting substantially opposed and aligned conductive terminals of a pair of spaced circuit devices which comprises:
    a wiring support body formed of a resilient material; and
    a sheet of flexible insulation material secured to and extending over opposed outer surfaces of said resilient support body, a plurality of paired conductive contacts formed on said flexible sheet with each contact of a pair of contacts being disposed on opposite outer surfaces of said support body, a like plurality of conductive strips on said flexible sheet with each strip interconnecting a pair of oppositely disposed contacts, said contacts being exposed at an outer surface of said sheet and in engagement with the conductive terminals of said circuit devices, said contacts being small and closely spaced, each terminal of said circuit devices engaging at least two of said contacts.

2. The interconnection module as defined in claim 1 wherein said contacts and conductive strips are plated on the outer surface of said flexible sheet and said sheet has an opposite, inner surface adjacent said supporting body.

3. The interconnection module as defined in claim 2 further including a thin film of an insulation material covering said flexible sheet, said film having perforations therein exposing only the contacts on said sheet.

4. The interconnection module as defined in claim 3 wherein said resilient support body is formed of an elastomeric material and said flexible sheet is formed of a material selected from the group consisting of polyethylene terephthalate and polyimide.

5. The interconnection module as defined in claim 1 wherein said flexible sheet has an inner surface located adjacent said support body, said conductive strips being formed on said inner surface of the sheet and covered by the sheet; said sheet having apertures therein located adjacent the ends of each conductive strip and said contacts being located in said apertures.

6. A non-registered multiple interconnection module providing a conductive interconnection between opposed and substantially aligned conductive terminals on a pair of spaced circuit devices or the like, comprising:
    a resilient support body formed of an electrically insulative elastomeric material having opposed outer surfaces disposed between said circuit devices; and
    a sheet of flexible insulation material secured to and extending over said opposed outer surfaces of said support body,
    said flexible sheet having a plurality of paired conductive contacts thereon in a closely spaced pattern with the contact of each pair being disposed on opposite sides of said support body, a plurality of conductive strips on said flexible sheet with each strip interconnecting a pair of contacts, and
    each pair of contacts being located in opposed alignment with each other and exposed at the outer surface of said strip, more than one contact engaging each aligned conductive terminal of said circuit devices.

7. The multiple interconnection module as defined in claim 6 wherein said contacts and said conductive strips are formed on the outer surface of said flexible sheet.

8. The multiple interconnection module as defined in claim 7 further comprising a thin film of insulative material covering said flexible sheet, said film having perforations therein exposing only the contacts on said sheet therethrough.

9. The multiple interconnection module as defined in claim 6 wherein said conductive strips are plated on the surface of said sheet adjacent said support body; said sheet having apertures formed therein located adjacent the ends of each conductive strip and said contacts being located in said apertures.

* * * * *